United States Patent [19]

Honda

[11] 4,264,883

[45] Apr. 28, 1981

[54] REVERBERATION ANNEXATION DEVICE

[76] Inventor: Chuzo Honda, 2-45, Shiroki-cho, Chikusa-ku, Nagoya-shi, Aichi-ken, Japan

[21] Appl. No.: 29,488

[22] Filed: Apr. 12, 1979

[30] Foreign Application Priority Data

May 10, 1978 [JP] Japan .................................. 53/55109

Jun. 12, 1978 [JP] Japan ............................ 53/80126[U]

[51] Int. Cl.³ ............................................... H03H 9/30

[52] U.S. Cl. ...................................... 333/146; 84/1.25

[58] Field of Search ................................ 333/141-142, 333/143, 145-146, 148; 310/26; 84/1.24, 1.25, DIG. 21, DIG. 24, DIG. 26

[56] References Cited

U.S. PATENT DOCUMENTS 3,106,610 10/1963 Young .............................. 84/1.24 X

*Primary Examiner*—Marvin L. Nussbaum

*Attorney, Agent, or Firm*—Wenderoth, Lind & Ponack

[57] ABSTRACT

In a device for annexing a reverberation sound similar to natural reverberation in the course of sound recording, an elastic raw material such as a leaf spring is bent into a bridge element of any shape such as a stanchion ( ┌┐ ), or M-shape provided with a pair of rising foot portions. The bridge element is interposed in an intermediate portion of a coiled spring which is spanned between a drive-transducer and a pickup-transducer. Vibration which is applied along the helical direction of the coiled spring is transmitted, and at the same time the compressive movement of the coiled spring induced by said vibration is absorbed by means of spring action of the bridge element, thereby flutter modulation caused by the compressive movement of the coiled spring can be prevented. Moreover, irregular bending of any portion of the bridge element in front or rear direction can prevent induction of resonance in the audio frequency range.

9 Claims, 14 Drawing Figures

REVERBERATION ANNEXATION DEVICE

BACKGROUND OF THE INVENTION

The present invention falls into the field of reverberation annexation devices which use coiled springs as the raw materials for a signal retardation device.

Generally in a reverberation annexation device wherein a coiled spring is used as raw material for a signal retardation device and spanned between a drive-transducer and a pickup-transducer, the mechanical vibration impressed on one end of the coiled spring by the drive-transducer is helically transmitted along the coiled spring, that is, along the helical direction to the pickup-transducer.

The vibration is transmitter to one end of the coiled spring and picked up by the pickup-transducer, and at the same time it is reflected at the end and transmitted from the reflecting point in the reverse direction, that is, to the drive-transducer. Intermittently repeated reflection of the vibration at both ends of the coiled spring permits the pickup-transducer to pick up a group of signals which are subjected to continuous retardation in time, thereby reverberation sound is obtained.

Although the mechanical vibration is not impressed in the longitudinal direction but in the helical direction of the coiled spring as above described, repeated reflection of the vibration at both ends induces the compressive movement in the longitudinal direction of the coiled spring, which movement is inherent generally in coiled springs. In other words, mode change is effected from the vibration transmission along the helical direction to the compressive movement of the coiled spring. The compressive movement is reflected at both ends of the coiled spring independently from the reverberation signal transmitted along the helical direction of the coiled spring. The repeated reflection of the compressive movement causes the stationary wave to the coiled spring.

Generation of the stationary wave modulates said reverberant vibration. The modulation causes flutter-like sound, which is neither musical nor realistic.

The inventor of the present application has provided a method for eliminating such disadvantages of the system described in U.S. Pat. No. 4,112,396.

In said patent, a part of the coiled spring is constituted as a protrusion which extends further than the coil radius with respect to the center axis of the coiled spring. The protrusion absorbs the compressive movement of the coiled spring, as a result the flutter modulation can be prevented. However, since the protrusion is constituted by utilizing a part of the coiled spring and integral with the coil portion, the protrusion has some of the properties of a coiled spring, that is, it transmits some of the compressive movement induced in the coiled spring. Therefore a number of protrusions must be arranged on the coiled spring in order to completely absorb the induced compressive movement by means of the protrusions. Further the bending work of the coil to produce each protrusion is inevitably carried out by means of handwork, because the protrusion is formed by extending a part of the coil and integral therewith as above described. Therefore it is difficult to carry out the mass production with the same form and quality at low cost.

SUMMARY OF THE INVENTION

An object of the present invention is to provide a reverberation annexation device wherein elastic material such as leaf spring is bent into a bridge element of any shape such as stanchion ( ┌┐ ), M-shape and the like, the bridge element is interposed in intermediate portion of a coiled spring, and both ends of the coiled spring are spanned between a drive-transducer and a pickup-transducer, thereby the compressive movement of the coiled spring is completely absorbed, and generation of the flutter modulation is completely prevented.

Another object of the present invention is to provide a reverberation annexation device which can prevent the induction of resonance in audio frequency range by bending any portion of said bridge element irregularly in any direction.

A further object of the present invention is to provide a reverberation annexation device which can be manufactured readily in mass production with the same form and quality by making the bridge element of raw material separate from the coiled spring.

Other and further objects and advantages of the present invention will become apparent from the following description taken in connection with the accompanying drawings.

DESCRIPTION OF THE PREFERRED EMBODIMENTS

The detailed description of the present invention is given according to the figures annexed.

Figure 1:
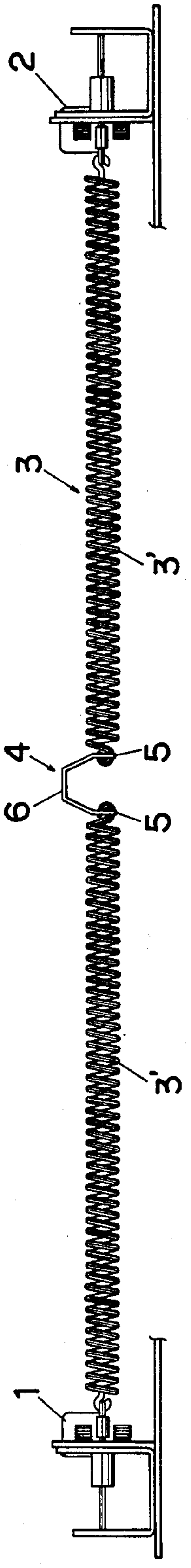
FIG. 1 is a side view illustrating a first embodiment.
Figure 2:
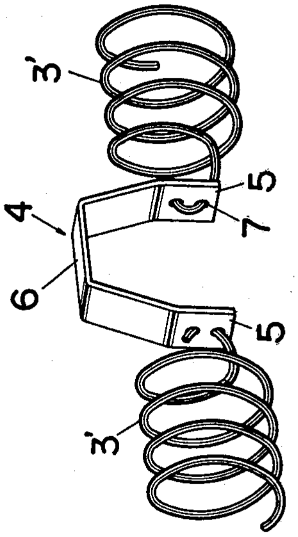
FIG. 2 is an enlarged perspective view of essential part in the first embodiment.
Figure 3:
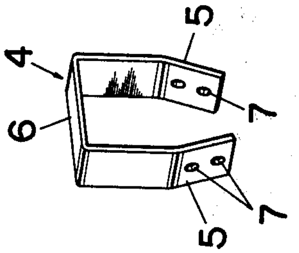
FIG. 3 is a perspective view of a bridge element in the first embodiment.

In FIG. 1, (1) designates a drive-transducer, (2) designates a pickup-transducer, and (3) designates a coiled spring spanned between both transducers (1) and (2). The coiled spring (3) comprises at least two separate coiled spring segements (3') (3') which are connected in series through a bridge element (4) as hereinafter described. The bridge element (4) is made of a raw material such as a leaf spring which can be elastically deformed. The bridge element (4) is constituted separate from the coiled spring (3). The bridge element (4) consists of a pair of foot portions (5) (5) and a connecting bar (6), so that a stanchion shape ( ⊓ ) is constituted. When the bridge element (4) is spanned between two coiled spring segments (3') (3'), both foot portions (5) (5) of the bridge element (4) rise in approximately perpendicular direction to the winding center axis of continuous coils of the coiled spring (3). The connecting bar (6) connects the top ends of both foot portions (5) (5) along the parallel line to the winding center axis of the coiled spring segments (3') (3'). The base of each of the foot portions (5) (5) is provided with inserting holes (7) (7), (7) (7) in which the ends of said coiled spring segments (3') (3') are inserted respectively, thereby the bridge element (4) is connected with the opposite ends of both coiled spring segments (3') (3'). In addition, the connecting method of each end of the coiled spring segments (3') (3') with both foot portions (5) (5) is not restricted to the above described method, but conventional mechanical connecting methods such as a welding method, a jig method and the like may be selected at will. Spring action of both foot portions (5) (5) of the interposed bridge element (4) which is bent in a stanchion shape ( ⊓ ) can absorb the compressive movement induced by the vibration wave which is applied to the drive-transducer (1) and repeatedly reflected at both ends of the coiled spring (3). As a result, flutter modulation caused by the compressive movement of the coiled spring (3) can be completely prevented.

Figure 5:
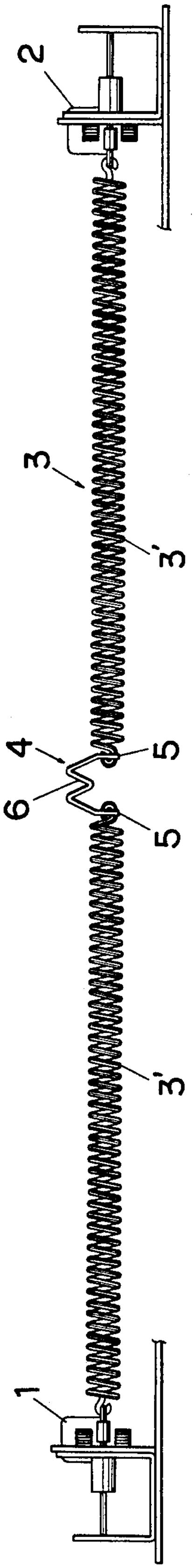
FIG. 5 is a side view illustrating a second embodiment.
Figure 6:
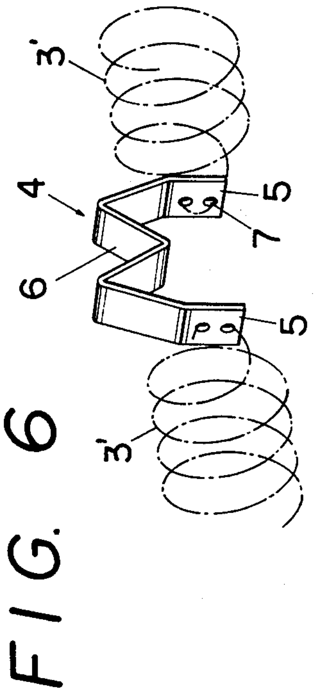
FIG. 6 is an enlarged perspective view of essential part in the second embodiment.

FIGS. 5 and 6 illustrate a second embodiment, wherein the connecting bar (6) of the bridge element (4) is bent downwards into V-shape thereby the bridge element (4) as a whole is constituted in M-shape.

Figure 7:
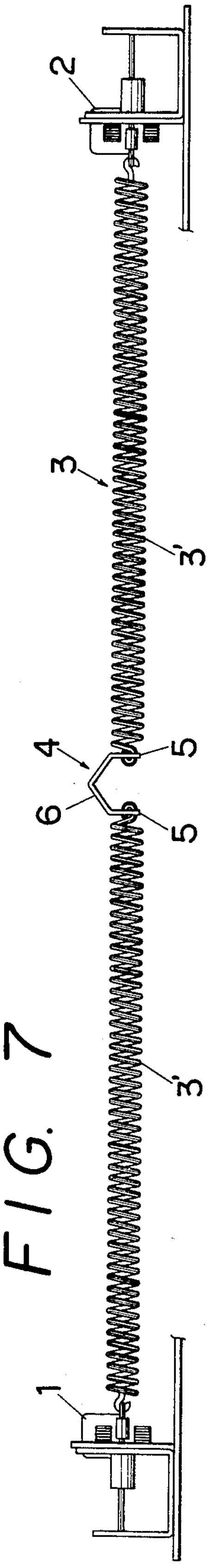
FIG. 7 is a side view illustrating a third embodiment.
Figure 8:
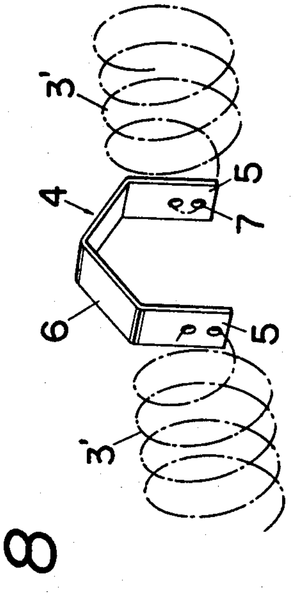
FIG. 8 is an enlarged perspective view of essential part in the third embodiment.

FIGS. 7 and 8 illustrate a third embodiment, wherein the connecting bar (6) of the bridge element (4) is bent upwards into reverse V-shape to the contrary with said second embodiment.

Figure 9:
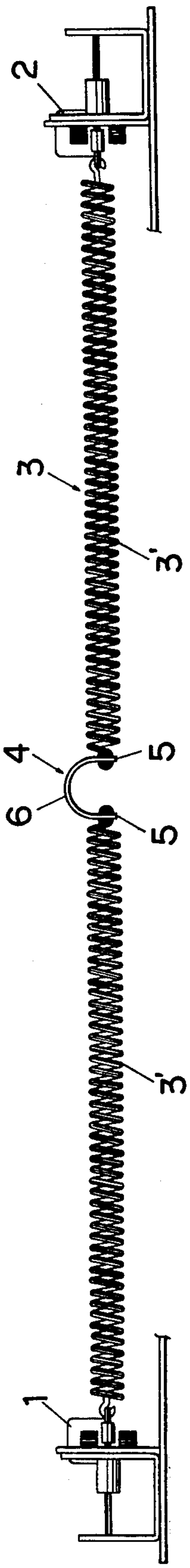
FIG. 9 is a side view illustrating a fourth embodiment.
Figure 10:
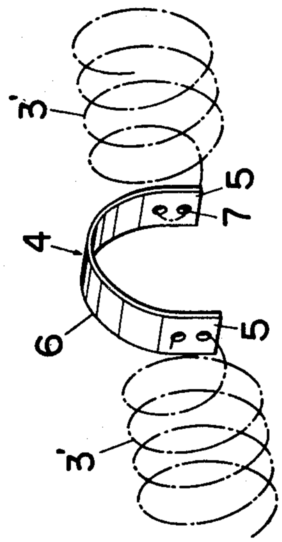
FIG. 10 is an enlarged perspective view of essential part in the fourth embodiment.

FIGS. 9 and 10 illustrate a fourth embodiment, wherein both foot portions (5) (5) and the connecting bar (6) therebetween are so bent that the bridge element (4) as a whole is constituted in an arch shape.

Figure 11:
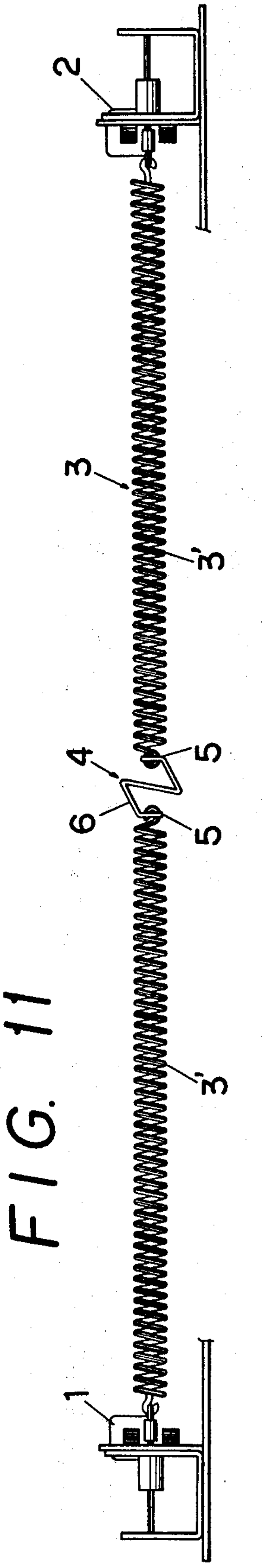
FIG. 11 is a side view illustrating a fifth embodiment.
Figure 12:
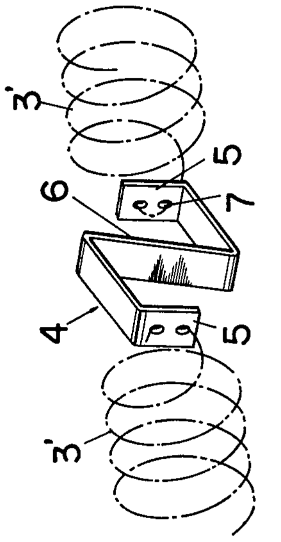
FIG. 12 is an enlarged perspective view of essential part in the fifth embodiment.

FIGS. 11 and 12 illustrate a fifth embodiment, wherein the bridge element (4) is bent into Z-shape.

Figure 13:
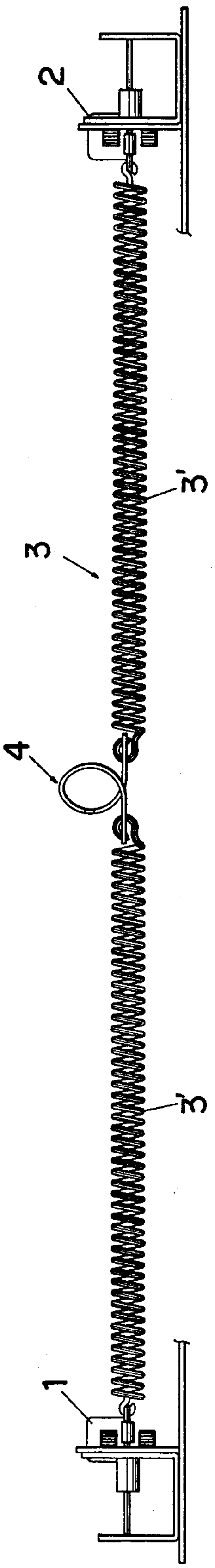
FIG. 13 is a side view illustrating a sixth embodiment.
Figure 14:
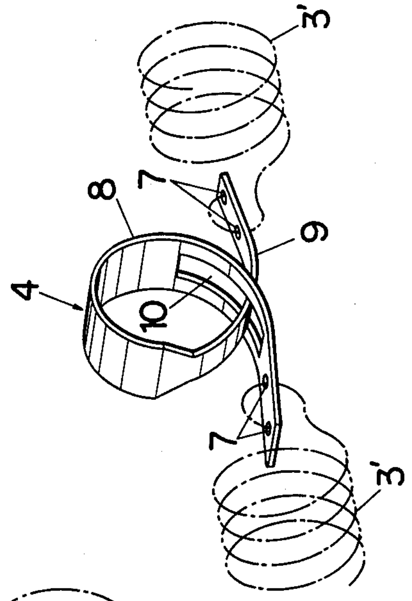
FIG. 14 is an enlarged perspective view of essential part in the sixth embodiment.

FIGS. 13 and 14 illustrate a sixth embodiment which is a modification of said fourth embodiment and provided with the bridge element (4) bent into "l" shape as a whole. The bridge element (4) is made of a leaf spring which can be elastically deformed, and it is constituted separate from the coiled spring (3). The bridge element (4) is constituted in a strip with suitable length and width. One of the foot portions (5) (5) is provided with a widened portion (8); the other foot portion (5) is provided with a narrowed portion (9) which is a little narrower than the widened portion (8). The widened portion (8) is provided with a slot (10) which is nearly as wide as the narrowed portion (9). The narrowed portion (9) is inserted in the slot (10) by means of the elastic deformation so that the bridge element (4) is bent into "l" shape. The top ends of the widened portion (8) and the narrowed portion (9) are respectively provided with inserting holes (7) (7), (7) (7) in which the opposite ends of the coiled springs segments (3') (3') are inserted, thereby the bridge element (4) is integrally engaged with both coiled spring segments (3') (3').

Figure 4:
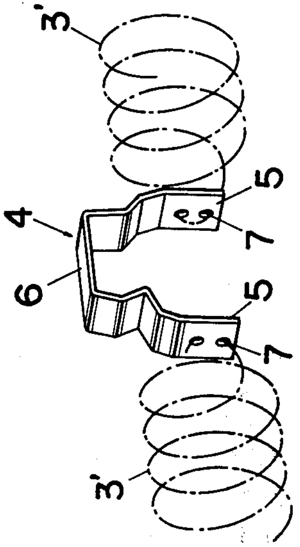
FIG. 4 is an enlarged perspective view of essential part of a modified embodiment from the first embodiment.

FIG. 4 illustrates a modification of the first embodiment. In the modified embodiment, any portion in both foot portions (5) (5) of the bridge element (4) is irregulary bent in any direction in order to prevent resonance. Between the coiled spring segments (3') (3') is interposed the bridge element (4) comprising the foot portions (5) (5) which rise in approximately perpendicular direction to the winding center axis of the continuous coils constituting the coiled spring segments (3') (3') in order that the compressive movement of the coiled spring (3) is absorbed by means of the spring action of the foot portions (5) (5) and flutter modulation is prevented as above described. Although the flutter modulation can be prevented by such constitution that the bridge element (4) comprising a pair of rising foot portions (5) (5) is interposed between the coiled spring segments (3') (3'), the constitution may cause resonance of the bridge element (4) in audio frequency range. In the present invention, the resonance of the bridge element (4) in audio frequency range can be securely and readily prevented by means of the constitution that any portion of the foot portions (5) (5) is bent in both front and rear directions e.g. as shown in FIG. 4.

By means of such a constitution as above described, the present invention enables one to obtain artificial reverberation similar to natural reverberation, i.e. the reverberation which is quite similar to that in a concert hall.

In the present invention, the bridge element is made of a raw material such as a leaf spring, which has excellent elasticity and is more rigid than the coiled spring, and is constituted separate from the coiled spring and interposed between the coiled spring segments. The present invention is superior to said U.S. Pat. No. 4,112,396 in that the compressive movement of the coiled spring is suppressed and the previously induced compressive movement is absorbed more effectively. As a result, it is possible to decrease the number of the bridge elements to be inserted between the coiled spring segments. Furthermore, the constitution of the bridge element separate from the coiled spring permits one to carry out readily the mass production with the same form and quality.

What is claimed is:

1. A reverberation annexation device for use in an apparatus having a drive-transducer and a pickup-transducer, said device comprising:

a continuous coiled spring which is helically wound about the center axis and connected between said drive-transducer and said pickup-transducer, said drive-transducer and said pickup-transducer being oppositely spaced by a given distance, said coiled spring being spanned between the drive-transducer and the pickup-transducer, said coiled spring being composed of continuous coils of equal diameter around the winding center axis, said coiled spring comprising at least two coiled spring segments which are aligned in series; and a bridge element which is made of an elastic raw material and comprises a pair of foot portions rising in approximately perpendicular direction to the winding center line and a connecting bar to connect both foot portions, the foot portions of said bridge element being connected to corresponding ends of said coiled spring segments.

2. A reverberation annexation device as claimed in claim 1, wherein the connecting bar of the bridge element is arranged along the parallel line to the winding center axis of the coiled spring thereby the bridge element as a whole is constituted in a stanchion shape ( ⊓ ).

3. A reverberation annexation device as claimed in claim 1, wherein the connecting bar of the bridge element is bent downwards into V-shape thereby the bridge element as a whole is constituted in M-shape.

4. A reverberation annexation device as claimed in claim 1, wherein the connecting bar of the bridge element is bent upwards into reverse V-shape.

5. A reverberation annexation device as claimed in claim 1, wherein the bridge element as a whole is bent into an arch shape.

6. A reverberation annexation device as claimed in claim 1, wherein at least one portion of said bridge element is bent into an irregular shape for reducing the mechanical resonance thereof.

7. A reverberation annexation device for use in an apparatus having a drive-transducer and a pickup-transducer, said device comprising:

a continuous coiled spring which is helically wound about the center axis and connected between said drive-transducer and said pickup-transducer, said drive-transducer and said pickup-transducer being oppositely spaced by a given distance, said coiled spring being spanned between the drive-transducer and the pickup-transducer, said coiled spring being composed of continuous coils of equal diameter around the winding center axis, said coiled spring comprising at least two coiled spring segments which are aligned in series; and a bridge element which is made of an elastic raw material and comprises an "l" shaped loop, the ends thereof forming foot portions of said bridge element, said foot portions connected to corresponding ends of said coiled spring segments.

8. A reverberation annexation device as claimed in claim 7, wherein one of the foot portions of the bridge element is constituted as a narrowed portion, and the other foot portion is constituted as a widened portion which is provided with a slot in which the narrowed portion is inserted.

9. A reverberation annexation device as claimed in claims 1, 2, 3, 4, 5, 8, 7, or 6 wherein the bridge element is arranged in the proximity of the drive-transducer or the pickup-transducer at both ends of the coiled spring.

* * * * *